United States Patent
Leipold et al.

(10) Patent No.: US 10,917,145 B2
(45) Date of Patent: Feb. 9, 2021

(54) RADIO FREQUENCY TRANSMITTER WITH REDUCED INTERCONNECT SIGNAL PATHS FOR BEAMFORMING

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 8 days.

(21) Appl. No.: 16/285,612

(22) Filed: Feb. 26, 2019

(65) Prior Publication Data

US 2019/0326958 A1    Oct. 24, 2019

Related U.S. Application Data

(60) Provisional application No. 62/660,367, filed on Apr. 20, 2018.

(51) Int. Cl.
*H04B 7/0413* (2017.01)
*H01Q 3/26* (2006.01)
(Continued)

(52) U.S. Cl.
CPC ............. *H04B 7/0413* (2013.01); *H01Q 3/26* (2013.01); *H01Q 21/0006* (2013.01); *H03F 3/24* (2013.01); *H04B 7/0617* (2013.01)

(58) Field of Classification Search
CPC .... H01Q 3/26; H03F 3/24; H03F 3/68; H04B 1/0458; H04B 1/0483; H04B 7/0413; H04B 7/0617
See application file for complete search history.

(56) References Cited

U.S. PATENT DOCUMENTS

2012/0076229 A1* 3/2012 Brobston ................. H04B 1/28
                                                        375/295
2013/0137381 A1* 5/2013 Vassiliou ................. H04B 1/56
                                                        455/67.15
(Continued)

FOREIGN PATENT DOCUMENTS

WO    2016153914 A1    9/2016

OTHER PUBLICATIONS

International Search Report and Written Opinion for International Patent Application No. PCT/US2019/028009, dated Jul. 12, 2019, 14 pages.

(Continued)

*Primary Examiner* — Awet Haile
(74) *Attorney, Agent, or Firm* — Withrow & Terranova, P.L.L.C.

(57) ABSTRACT

A radio frequency (RF) transmitter includes transceiver circuitry coupled to front end circuitry via an interconnect signal path. The transceiver circuitry is configured to generate a number of frequency-shifted RF beamforming signals such that each one of the frequency-shifted RF beamforming signals has a different frequency, and multiplex the frequency-shifted RF beamforming signals to provide a multiplexed interconnect signal. The front-end circuitry is configured to receive the multiplexed interconnect signal from the transceiver circuitry via the interconnect signal path, demultiplex the multiplexed interconnect signal to isolate each of the frequency-shifted RF beamforming signals, shift a frequency of each one of the frequency-shifted RF beamforming signals to provide a number of RF beamforming signals, and transmit each of the RF beamforming signals from a different antenna.

20 Claims, 8 Drawing Sheets

(51) Int. Cl.
*H03F 3/24* (2006.01)
*H04B 7/06* (2006.01)
*H01Q 21/00* (2006.01)

(56) References Cited

U.S. PATENT DOCUMENTS

2017/0085005 A1* 3/2017 Aue .......................... H03F 3/24
2017/0180026 A1* 6/2017 Flynn .................... H03M 3/458
2017/0346506 A1 11/2017 Perumana et al.

OTHER PUBLICATIONS

International Preliminary Report on Patentability for International Patent Application No. PCT/US2019/028009, dated Oct. 29, 2020, 9 pages.

* cited by examiner

RADIO FREQUENCY TRANSMITTER WITH REDUCED INTERCONNECT SIGNAL PATHS FOR BEAMFORMING

RELATED APPLICATIONS

This application claims the benefit of provisional patent application Ser. No. 62/660,367, filed Apr. 20, 2018, the disclosure of which is hereby incorporated herein by reference in its entirety.

FIELD OF THE DISCLOSURE

The present disclosure relates to systems and methods for reducing the number of interconnect signal paths in a radio frequency (RF) system that is capable of performing beamforming.

BACKGROUND

Beamforming for radio frequency (RF) signals has the potential to greatly improve transmission and reception characteristics thereof. At a high level, beamforming involves transmitting a number of RF beamforming signals from different antennas such that the RF beamforming signals constructively and destructively interfere with one another to provide an aggregated RF beamforming signal that is strongest in the direction of a receiver. To achieve the desired constructive and destructive interference, the frequency of the RF beamforming signals is kept the same while the amplitude and phase of each one of the RF beamforming signals is adjusted individually. Using beamforming has the potential to increase signal strength between a transmitter and a receiver as well as reduce interference generated by the transmitter with respect to other nearby devices.

FIG. 1 shows a conventional RF transmitter 10 capable of performing beamforming. The conventional RF transmitter 10 includes transceiver circuitry 12, a number of interconnect signal paths 14, front-end circuitry 16, and a number of antennas 18. The transceiver circuitry 12 is coupled to the front-end circuitry 16 via the interconnect signal paths 14. The front-end circuitry 16 is coupled to the antennas 18.

In operation, the transceiver circuitry 12 generates a number of beamforming RF signals $BF_1$-$BF_4$, each of which is provided to the front-end circuitry 16 via a different one of the interconnect signal paths 14. Specifically, a first beamforming RF signal $BF_1$ is generated by the transceiver circuitry 12 and provided to the front-end circuitry 16 via a first interconnect signal path 14A, a second beamforming RF signal $BF_2$ is generated by the transceiver circuitry 12 and provided to the front-end circuitry 16 via a second interconnect signal path 14B, a third beamforming RF signal $BF_3$ is generated by the transceiver circuitry 12 and provided to the front-end circuitry 16 via a third interconnect signal path 14C, and a fourth beamforming RF signal $BF_4$ is generated by the transceiver circuitry 12 and provided to the front-end circuitry 16 via a fourth interconnect signal path 14D. The front-end circuitry 16 amplifies the beamforming RF signals $BF_1$-$BF_4$ for transmission from the antennas 18. Specifically, the front-end circuitry 16 amplifies the first beamforming RF signal $BF_1$ for transmission from a first antenna 18A, amplifies the second beamforming RF signal $BF_2$ for transmission from a second antenna 18B, amplifies the third RF beamforming signal $BF_3$ for transmission from a third antenna 18C, and amplifies the fourth RF beamforming signal $BF_4$ for transmission from a fourth antenna 18D.

As discussed above, the frequency of each one of the RF beamforming signals $BF_1$-$BF_4$ is the same, but the phase and amplitude of the signals is individually configured to provide constructive and destructive interference such that the combination of the RF beamforming signals $BF_1$-$BF_4$ after radiation from the antennas 18 is strongest in the direction of a receiver (not shown). Since the transceiver circuitry 12 generates the RF beamforming signals $BF_1$-$BF_4$, it is responsible for determining the necessary phase and amplitude adjustments thereto to produce the desired constructive and destructive interference.

While the conventional RF transmitter 10 is able to successfully perform beamforming, it requires a separate interconnect signal path 14 between the transceiver circuitry 12 and the front-end circuitry 16 for each RF beamforming signal $BF_1$-$BF_4$ transmitted therefrom. In mobile devices, the transceiver circuitry 12 is normally centrally located, and multiple front-end circuitries 16 are distributed across the area of the device (e.g., in the corners thereof). Accordingly, interconnect signal paths 14 are generally expensive in terms of both cost and space (especially considering that they are normally implemented at least in part using a coaxial cable), and it is generally desirable to minimize the number of interconnect signal paths 14 between transceiver circuitry 12 and front-end circuitry 16. In light of the above, there is a need for improved RF transmitter circuitry capable of performing beamforming while simultaneously minimizing the number of interconnect signal paths between the transceiver circuitry and the front-end circuitry therein.

SUMMARY

In one embodiment, a radio frequency (RF) transmitter includes transceiver circuitry coupled to front end circuitry via an interconnect signal path. The transceiver circuitry is configured to generate a number of frequency-shifted RF beamforming signals such that each one of the frequency-shifted RF beamforming signals has a different frequency, and multiplex the frequency-shifted RF beamforming signals to provide a multiplexed interconnect signal. The front-end circuitry is configured to receive the multiplexed interconnect signal from the transceiver circuitry via the interconnect signal path, demultiplex the multiplexed interconnect signal to isolate each of the frequency-shifted RF beamforming signals, shift a frequency of each one of the frequency-shifted RF beamforming signals to provide a number of RF beamforming signals such that each one of the RF beamforming signals has the same frequency, and transmit each of the RF beamforming signals from a different antenna. By generating frequency-shifted RF beamforming signals and multiplexing them, all of the signals may be provided over a single interconnect signal path, which saves space and cost in the RF transmitter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
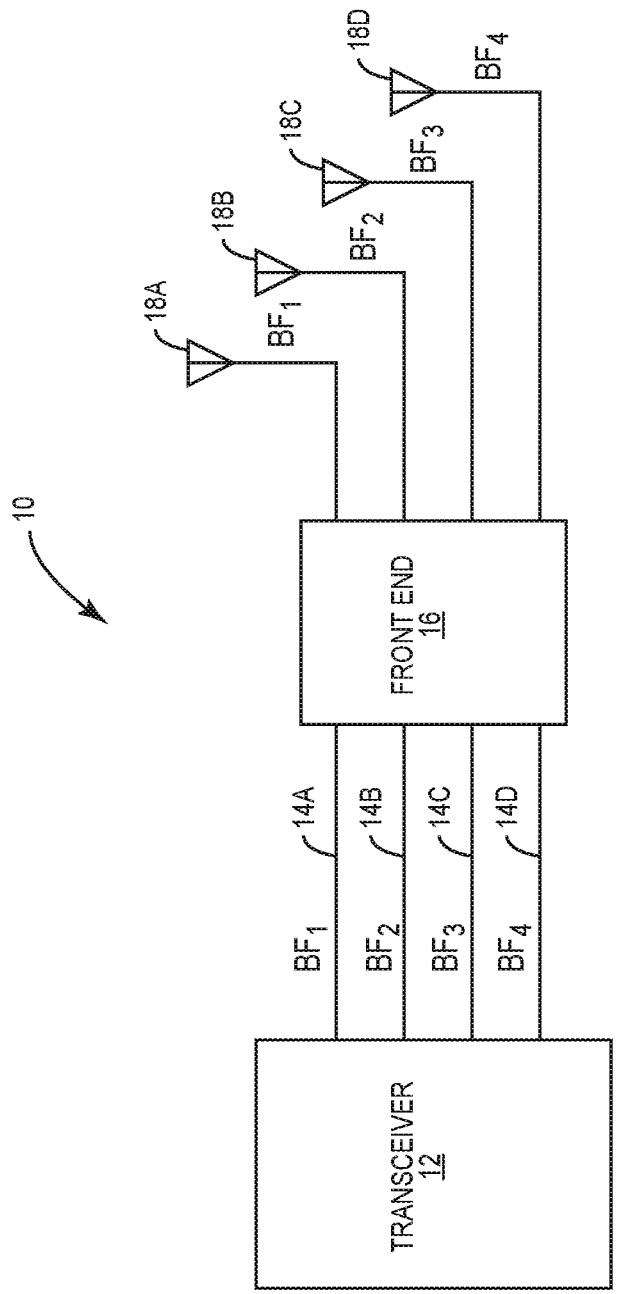
FIG. 1 illustrates a conventional radio frequency (RF) transmitter capable of performing beamforming.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to systems and methods for reducing the number of interconnect signal paths in a radio frequency (RF) system that is capable of performing beamforming. As discussed above, beamforming for RF systems involves generating a number of RF beamforming signals, each of which has the same frequency but a different phase and amplitude with respect to the others. The phase and amplitude of each one of the RF beamforming signals is tailored to provide constructive and destructive interference when the RF beamforming signals are transmitted from different antennas such that the aggregate of the RF beamforming signals is strongest in the direction of a receiver. At a high level, the present disclosure describes shifting a frequency of a number of RF beamforming signals such that each one of the RF beamforming signals has a different frequency with respect to the others. In some embodiments, the RF beamforming signals are significantly down-converted to reduce interference and attenuation as they travel through an interconnect signal path. The frequency-shifted RF beamforming signals are multiplexed such that they can be communicated to upstream circuitry via a single interconnect signal path via frequency division duplexing (FDD). Once communicated via a single interconnect signal path, the frequency-shifted RF beamforming signals are demultiplexed and restored to their original frequency without the use of a synthesizer.

Figure 2A:
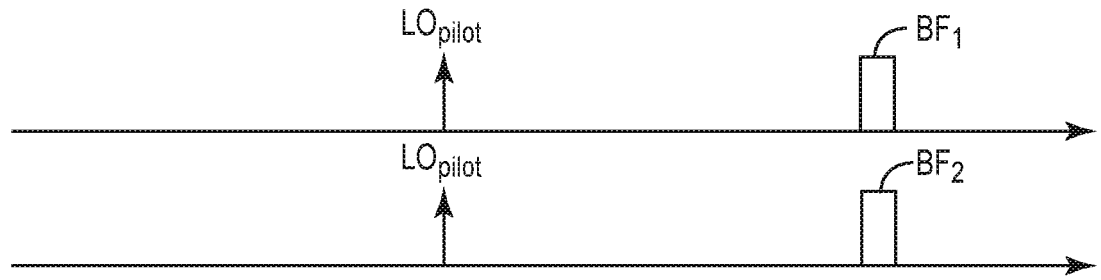
FIGS. 2A through 2D illustrate generating frequency-shifted RF beamforming signals and restoring RF beamforming signals from the frequency-shifted RF beamforming signals according to one embodiment of the present disclosure.
Figure 2B:
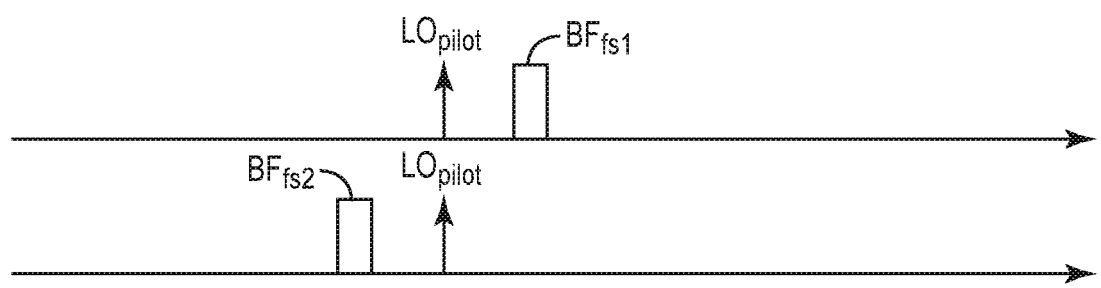
Figure 2C:
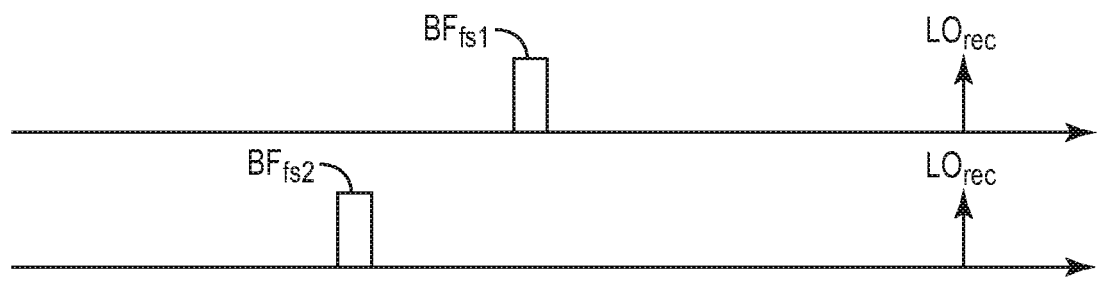
Figure 2D:

FIGS. 2A through 2D are diagrams illustrating how the frequency of a first RF beamforming signal $BF_1$ and a second RF beamforming signal $BF_2$ may be shifted to form a first frequency-shifted RF beamforming signal $BF_{fs1}$ and a second frequency-shifted RF beamforming signal $BF_{fs2}$, and subsequently shifted back to reconstruct the original first RF beamforming signal $BF_1$ and the second RF beamforming signal $BF_2$. In the diagrams, signals are shown on a frequency spectrum represented as a horizontal line, where the frequency increases as the location on the horizontal line moves right on the page. In FIG. 2A, the first RF beamforming signal $BF_1$ and the second RF beamforming signal $BF_2$ are shown having the same frequency, and a local oscillator pilot signal $LO_{pilot}$ is shown having a frequency below that of the first RF beamforming signal $BF_1$ and the second RF beamforming signal $BF_2$. Notably the frequency of the local oscillator pilot signal $LO_{pilot}$ may be chosen arbitrarily. However, when the first RF beamforming signal $BF_1$ and the second RF beamforming signal $BF_2$ are very high frequency signals (e.g., millimeter-wave signals such as those signals above 18 GHz intended for use in 5G networks), it may be beneficial to down-convert the signals into a lower frequency spectrum (e.g., the intermediate frequency spectrum) to avoid attenuation and interference that may occur as the signals travel through the interconnect signal path 24. These concepts are discussed at length in U.S. patent application Ser. No. 16/119,409, the contents of which are hereby incorporated by reference in their entirety. In FIG. 2B, the first RF beamforming signal $BF_1$ and the second RF beamforming signal $BF_2$ are mixed with the local oscillator pilot signal $LO_{pilot}$ to generate the first frequency-shifted RF beamforming signal $BF_{fs1}$ and the second frequency-shifted RF beamforming signal $BF_{fs2}$, both of which have different frequencies with respect to one another. To achieve this, the first RF beamforming signal $BF_1$ is mixed with the local oscillator pilot signal $LO_{pilot}$ using high-side mixing while the second RF beamforming signal $BF_2$ is mixed with the local oscillator pilot signal using low-side mixing. In FIG. 2C, a reconstruct local oscillator signal $LO_{rec}$ is generated from the local oscillator pilot signal $LO_{pilot}$, for example, by multiplying the local oscillator pilot signal $LO_{pilot}$ by a constant. As shown, the reconstruct local oscillator signal $LO_{rec}$ is at or near the original frequency of the first RF beamforming signal $BF_1$ and the second RF beamforming signal $BF_2$. In FIG. 2D, the first frequency-shifted RF beamforming signal $BF_{fs1}$ and the second frequency-shifted RF beamforming signal $BF_{fs2}$ are mixed with the reconstruct local oscillator signal $LO_{rec}$ to reconstruct the first RF beamforming signal $BF_1$ and the second RF beamforming signal $BF_2$. The same concepts may be applied to a larger number of RF beamforming signals, where one LO pilot signal $LO_{pilot}$ and one reconstruct local oscillator signal $LO_{rec}$ are needed for every two RF beamforming signals.

Figure 3:
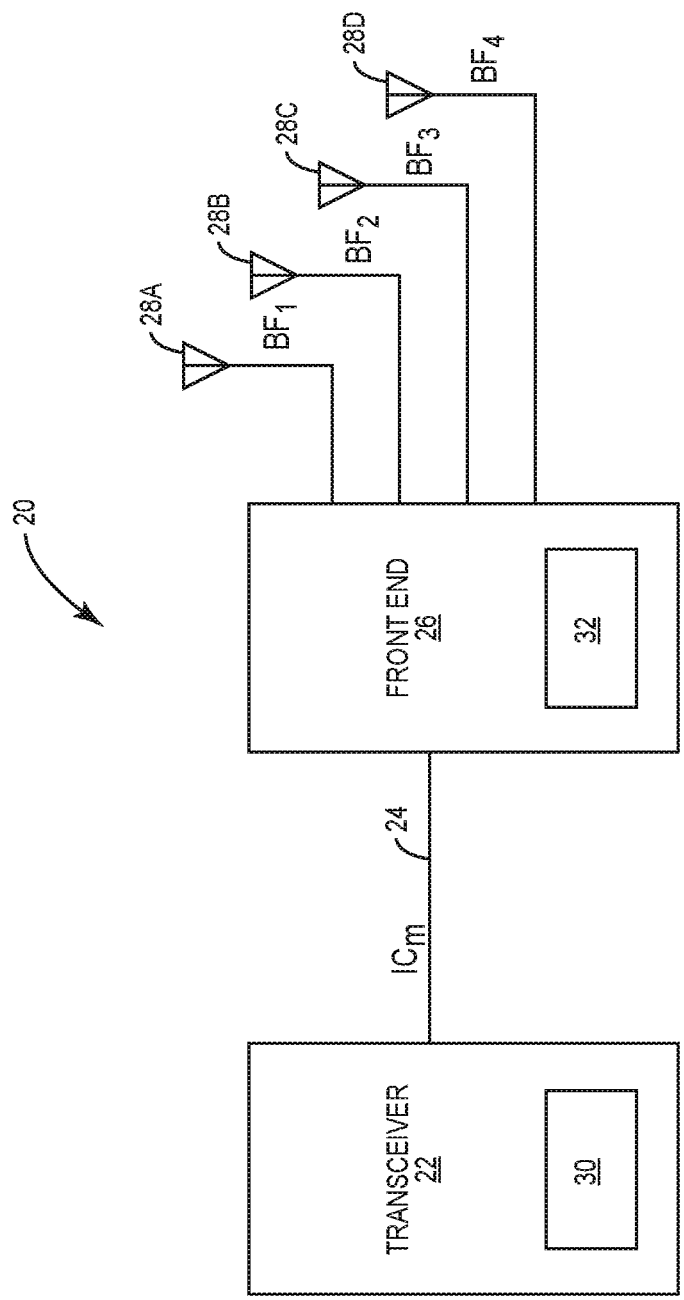
FIG. 3 illustrates an RF transmitter capable of performing beamforming according to one embodiment of the present disclosure.

FIG. 3 shows an RF transmitter 20 according to one embodiment of the present disclosure. The RF transmitter 20 includes transceiver circuitry 22, an interconnect signal path 24, front-end circuitry 26, and a number of antennas 28. The transceiver circuitry 22 is coupled to the front-end circuitry 26 via the interconnect signal path 24. The front-end circuitry 26 is coupled to the antennas 28. Notably, the RF transmitter 20 includes only a single interconnect signal path 24 but is capable of transmitting an arbitrary number of RF beamforming signals as discussed below. To enable this functionality, the transceiver circuitry 22 includes frequency-shifted RF beamforming signal generator circuitry 30 and the front-end circuitry 26 includes RF beamforming signal restoration circuitry 32.

In operation, the transceiver circuitry 22 including the Frequency-shifted RF beamforming signal generator circuitry 30 generates a number of frequency-shifted RF beamforming signals. Generating frequency-shifted RF beamforming signals allows the signals to be multiplexed (along with one or more other signals) to provide a multiplexed interconnect signal $IC_m$. Notably, standard RF beamforming signals cannot be multiplexed because they are located at the same frequency. The multiplexed interconnect signal $IC_m$ is provided from the transceiver circuitry 22 to the front-end circuitry 26 via the interconnect signal path 24.

The front-end circuitry 26 demultiplexes the multiplexed interconnect signal $IC_m$ to isolate each one of the frequency-shifted RF beamforming signals. The front-end circuitry 26 then shifts a frequency of each one of the frequency-shifted RF beamforming signals to restore them back to their original frequency, thus providing a number of RF beamforming signals from the frequency-shifted RF beamforming signals. Finally, the front-end circuitry 26 amplifies and transmits each one of the RF beamforming signals from a different one of the antennas 28.

In various embodiments, the transceiver circuitry 22 may generate the frequency-shifted RF beamforming signals in the digital domain, in the analog domain, or in a combination thereof (hybrid). In terms of power consumption and size, generating the frequency-shifted RF beamforming signals in the digital domain may be the preferred method for doing so. However, generating the frequency-shifted RF beamforming signals using digital circuitry may require very high clock and sampling rates, which may drive up the complexity and cost thereof. In one exemplary embodiment, baseband frequency-shifted RF beamforming signals are generated and multiplexed in the digital domain to provide a baseband multiplexed frequency-shifted RF beamforming signal, the baseband multiplexed frequency-shifted RF beamforming signal is converted to analog, and the analog baseband multiplexed frequency-shifted RF beamforming signal is mixed with a local oscillator signal to provide a multiplexed frequency-shifted RF beamforming signal. This multiplexed FDD RF beamforming signal may be further multiplexed via an analog multiplexer with one or more other signals as discussed in detail below before being sent to the front-end circuitry 26 via the interconnect signal path 24.

In an alternative embodiment, baseband frequency-shifted RF beamforming signals are generated in the digital domain, the baseband frequency-shifted RF beamforming signals are individually converted to analog baseband frequency-shifted RF beamforming signals, the analog baseband frequency-shifted RF beamforming signals are individually mixed with one or more local oscillator signals to provide frequency-shifted RF beamforming signals, and the frequency-shifted RF beamforming signals are multiplexed (optionally with one or more other signals) by analog multiplexer circuitry before being sent to the front-end circuitry 26 via the interconnect signal path 24.

In various embodiments, the frequency-shifted RF beamforming signal generator circuitry 30 may be digital or analog circuitry. Frequency-shifted RF beamforming signals may be generated in the digital domain already having a frequency shift with respect to one another, or they may be generated as standard RF beamforming signals and subsequently shifted in frequency by mixing with an analog signal. Further, RF beamforming signals may be multiplexed in the digital domain or by analog multiplexer circuitry. Those skilled in the art will appreciate that many different approaches for generating the frequency-shifted RF beamforming signals and multiplexing them with themselves and one or more other signals exist, all of which are contemplated herein.

As discussed in detail below, the transceiver circuitry 22 may supply a local oscillator pilot signal in the multiplexed interconnect signal $IC_m$ along with the frequency-shifted RF beamforming signals to the front-end circuitry 26. The front-end circuitry 26 may use this local oscillator pilot signal to generate one or more reconstruct local oscillator signals, which are mixed with the frequency-shifted RF beamforming signals to frequency shift the signals back to their original frequency and reconstruct the RF beamforming signals. Accordingly, the front-end circuitry 26 may not need and thus not include a synthesizer while retaining the ability to restore the frequency-shifted RF beamforming signals back to their original frequency. While multiple hardware examples are provided herein demonstrating different ways to carry out this process, those skilled in the art will appreciate that many different approaches for restoring the original frequency of the frequency-shifted RF beamforming signals exist, all of which are contemplated herein.

Figure 4:
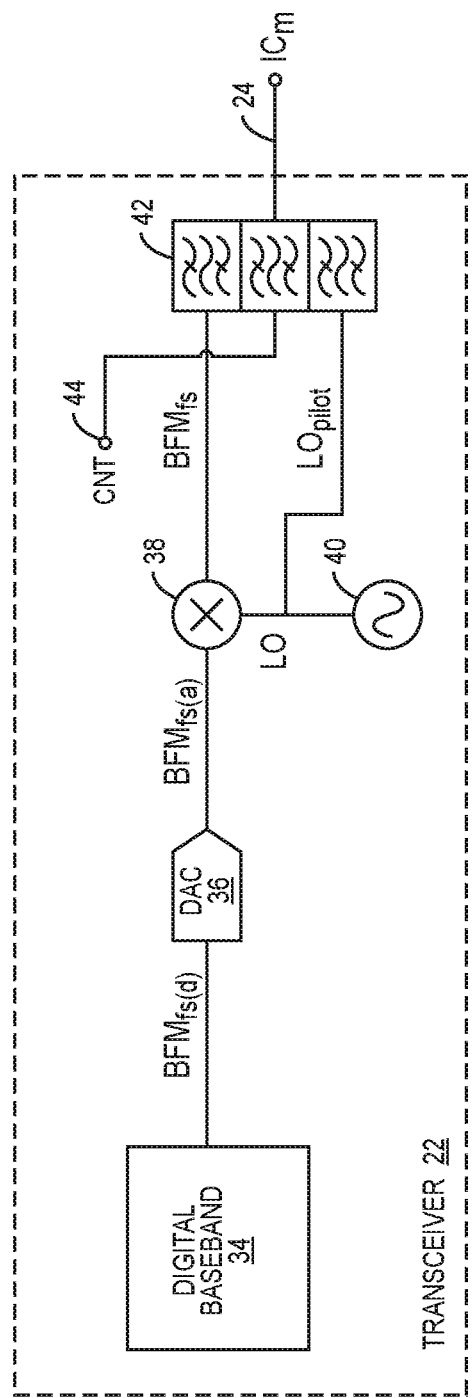
FIG. 4 illustrates transceiver circuitry according to one embodiment of the present disclosure.

FIG. 4 shows details of the transceiver circuitry 22 according to one embodiment of the present disclosure. The transceiver circuitry 22 includes digital baseband circuitry 34, digital-to-analog converter (DAC) circuitry 36, a mixer 38, local oscillator circuitry 40, and transceiver multiplexer circuitry 42. The digital baseband circuitry 34 is coupled to the DAC circuitry 36, which is in turn coupled to the mixer 38. The mixer 38 is coupled to the transceiver multiplexer circuitry 42. The local oscillator circuitry 40 is coupled to the mixer 38 and to the transceiver multiplexer circuitry 42. The transceiver multiplexer circuitry 42 is additionally coupled to a control signal input node 44 and the interconnect signal path 24.

In operation, the digital baseband circuitry 34 generates and multiplexes a number of baseband frequency-shifted RF beamforming signals in the digital domain to provide a digital multiplexed baseband frequency-shifted RF beamforming signal $BFM_{fs(d)}$. The digital multiplexed baseband frequency-shifted RF beamforming signal $BFM_{fs(d)}$ is provided to the DAC circuitry 36, which converts the signal to an analog multiplexed baseband frequency-shifted RF beamforming signal $BFM_{fs(a)}$. The analog multiplexed baseband frequency-shifted RF beamforming signal $BFM_{fs(a)}$ is then mixed by the mixer 38 with a local oscillator signal LO provided by the local oscillator circuitry 40 to generate a multiplexed frequency-shifted RF beamforming signal $BFM_{fs}$, which is provided to the transceiver multiplexer circuitry 42. The local oscillator circuitry 40 also provides the local oscillator signal LO as a local oscillator pilot signal $LO_{pilot}$ to the transceiver multiplexer circuitry 42. Finally, one or more control signals CNT are provided to the transceiver multiplexer circuitry 42 from the control signal input node 44. The transceiver multiplexer circuitry 42 multiplexes the multiplexed frequency-shifted RF beamforming signal $BFM_{fs}$, the local oscillator pilot signal $LO_{pilot}$, and the one or more control signals CNT to provide a multiplexed interconnect signal $IC_m$, which is provided via the interconnect signal path 24 to the front-end circuitry 26 (not shown). Due to the frequency shifting of the RF beamforming signals and multiplexing thereof, only one interconnect signal path 24 is needed to provide a number of RF beamforming signals from the transceiver circuitry 22 to the front-end circuitry 24.

Figure 5:
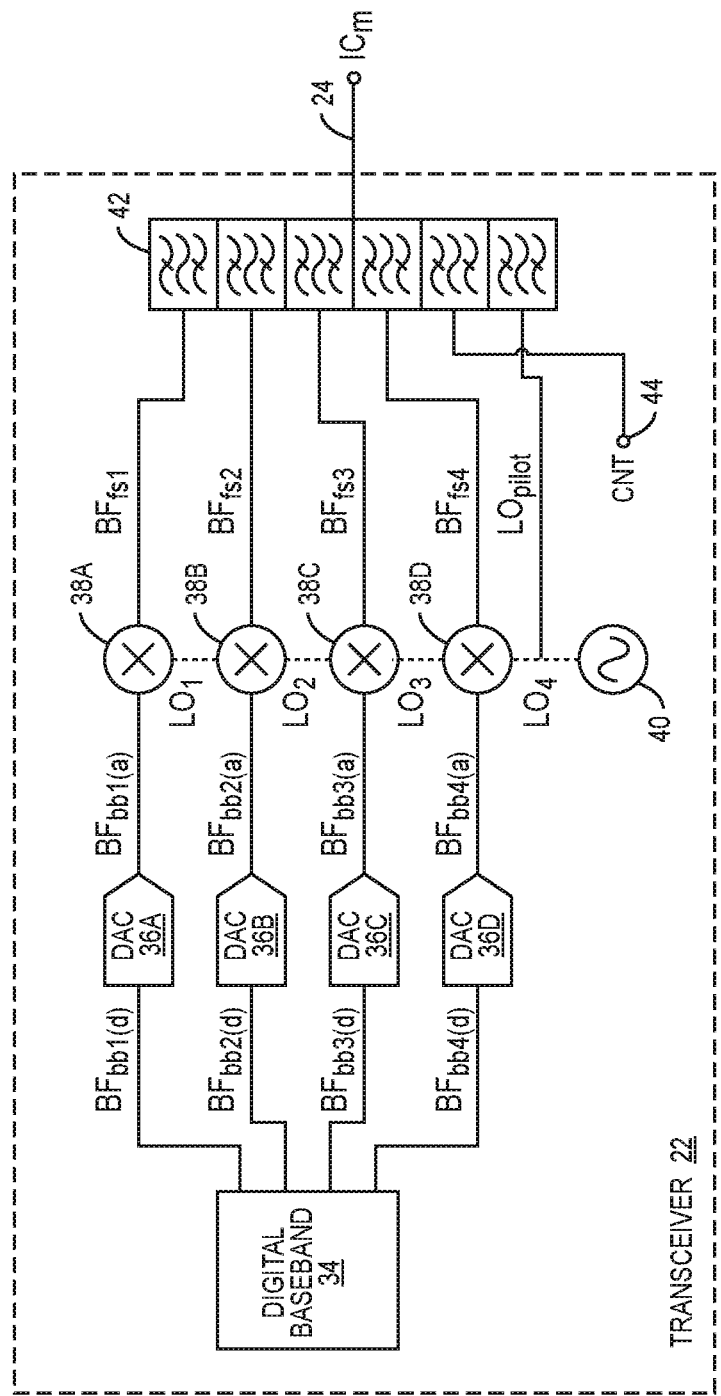
FIG. 5 illustrates transceiver circuitry according to one embodiment of the present disclosure.

In the embodiment shown in FIG. 4, the digital baseband circuitry 34 both generates and multiplexes the frequency-shifted RF beamforming signals in the digital domain. Accordingly, the frequency-shifted RF beamforming signal generator circuitry 30 includes the digital baseband circuitry 34 in the embodiment shown in FIG. 4. However, constraints on the digital baseband circuitry 34 may make such a process untenable or undesirable in certain circumstances. Accordingly, FIG. 5 shows the transceiver circuitry 22 according to an additional embodiment of the present disclosure. The transceiver circuitry 22 shown in FIG. 5 is substantially similar to that shown in FIG. 4, except that the digital baseband circuitry 34 separately provides individual digital baseband RF beamforming signals $BF_{bb1(d)}$-$BF_{bb4(d)}$ to separate DAC circuitry 36. Specifically, the baseband circuitry 34 generates a first digital baseband RF beamforming signal $BF_{bb1(d)}$ and provides the first digital baseband RF beamforming signal $BF_{bb1(d)}$ to first DAC circuitry 36A, generates a second digital baseband RF beamforming signal $BF_{bb2(d)}$ and provides the second digital baseband RF beamforming signal $BF_{bb2(d)}$ to second DAC circuitry 36B, generates a third digital baseband RF beamforming signal $BF_{bb3(d)}$ and provides the third digital baseband RF beamforming signal $BF_{bb3(d)}$ to third DAC circuitry 36C, and generates a fourth digital baseband RF beamforming signal $BF_{bb4(d)}$ and provides the fourth digital baseband RF beamforming signal $BF_{bb4(d)}$ to fourth DAC circuitry 36D.

The DAC circuitry 36 converts the digital baseband RF beamforming signals to analog and provides the analog signals to separate mixers 38. Specifically, the first DAC circuitry 36A converts the first digital baseband RF beamforming signal $BF_{bb1(d)}$ to a first analog baseband RF beamforming signal $BF_{bb1(a)}$ and provides the first analog baseband RF beamforming signal $BF_{bb1(a)}$ to a first mixer 38A, converts the second digital baseband RF beamforming signal $BF_{bb2(d)}$ to a second analog baseband RF beamforming signal $BF_{bb2(a)}$ and provides the second analog baseband RF beamforming signal $BF_{bb2(a)}$ to a second mixer 38B, converts the third digital baseband RF beamforming signal $BF_{bb3(d)}$ to a third analog baseband RF beamforming signal $BF_{bb3(a)}$ and provides the third analog baseband RF beamforming signal $BF_{bb3(a)}$ to a third mixer 38C, and converts the fourth digital baseband RF beamforming signal $BF_{bb4(d)}$ to a fourth analog baseband RF beamforming signal $BF_{bb4(a)}$ and provides the fourth analog baseband RF beamforming signal $BF_{bb4(a)}$ to a fourth mixer 38D.

The mixers 38 are provided with different local oscillator signals LO from the local oscillator circuitry 40. Specifically, the first mixer 38A is provided with a first local oscillator signal $LO_1$, the second mixer 38B is provided with a second local oscillator signal $LO_2$, the third mixer 38C is provided with a third local oscillator signal $LO_3$, and the fourth mixer 38D is provided with a fourth local oscillator signal $LO_4$. The local oscillator signals LO may be the same or different in various embodiments. In embodiments in which the digital baseband circuitry 34 generates the digital baseband RF beamforming signals as digital baseband frequency-shifted RF beamforming signals (i.e., the digital baseband circuitry 34 generates the digital baseband RF beamforming signals such that they are located at different frequencies with respect to one another), the local oscillator signals may all be the same. However, in embodiments in which the digital baseband circuitry 34 generates the digital baseband RF beamforming signals as standard RF beamforming signals at the same frequency, the local oscillator signals LO may be different to shift the frequencies of the RF beamforming signals with respect to one another so that each one has a unique frequency and thus can be properly multiplexed. Notably, a single local oscillator signal LO is capable of shifting the frequency of two analog baseband RF beamforming signals by up-mixing and down-mixing, respectively, and thus in cases in which the local oscillator signals LO are used to frequency shift the analog baseband RF beamforming signals the number of local oscillator signals LO required may be equal to the number of analog baseband RF beamforming signals divided by two. The local oscillator circuitry 40 may include only a single synthesizer and supporting circuitry to generate multiple local oscillator signals LO from the single oscillator, or may include multiple synthesizers.

The mixers 38 mix the respective analog baseband RF beamforming signals with a local oscillator signal to provide frequency-shifted RF beamforming signals. Specifically, the first mixer 38A mixes the first analog baseband RF beamforming signal $BF_{bb1(a)}$ with the first local oscillator signal $LO_1$ to provide a first frequency-shifted RF beamforming signal $BF_{fs1}$, the second mixer 38B mixes the second analog baseband RF beamforming signal $BF_{bb2(a)}$ with the second local oscillator signal $LO_2$ to provide a second frequency-shifted RF beamforming signal $BF_{fs2}$, the third mixer 38C mixes the third analog baseband RF beamforming signal $BF_{bb3(a)}$ with the third local oscillator signal $LO_3$ to provide a third frequency-shifted RF beamforming signal $BF_{fs3}$, and the fourth mixer 38D mixes the fourth analog baseband RF beamforming signal $BF_{bb4(a)}$ with the fourth local oscillator signal $LO_4$ to provide a fourth frequency-shifted RF beamforming signal $BF_{fs4}$.

The transceiver multiplexer circuitry 42 receives the first frequency-shifted RF beamforming signal $BF_{fs1}$, the second frequency-shifted RF beamforming signal $BF_{fs2}$, the third frequency-shifted RF beamforming signal $BF_{fs3}$, the fourth frequency-shifted RF beamforming signal $BF_{fs4}$, the local oscillator pilot signal $LO_{pilot}$, and the one or more control signals CNT and multiplexes these signals to provide the multiplexed interconnect signal $IC_m$ to the front-end circuitry 26 via the interconnect signal path 24. Due to the frequency shifting of the RF beamforming signals and multiplexing thereof, only one interconnect signal path 24 is needed to provide a number of RF beamforming signals from the transceiver circuitry 22 to the front-end circuitry 26.

While not shown in FIGS. 4 and 5, the local oscillator circuitry 40 may provide more than one local oscillator pilot signal $LO_{pilot}$ to the transceiver multiplexer circuitry 42 such that more than one local oscillator pilot signal $LO_{pilot}$ is included in the multiplexed interconnect signal $IC_m$. The number of local oscillator pilot signals $LO_{pilot}$ provided by the local oscillator circuitry 40 may be equal to the number of local oscillator signals LO produced thereby in various embodiments.

Figure 6:
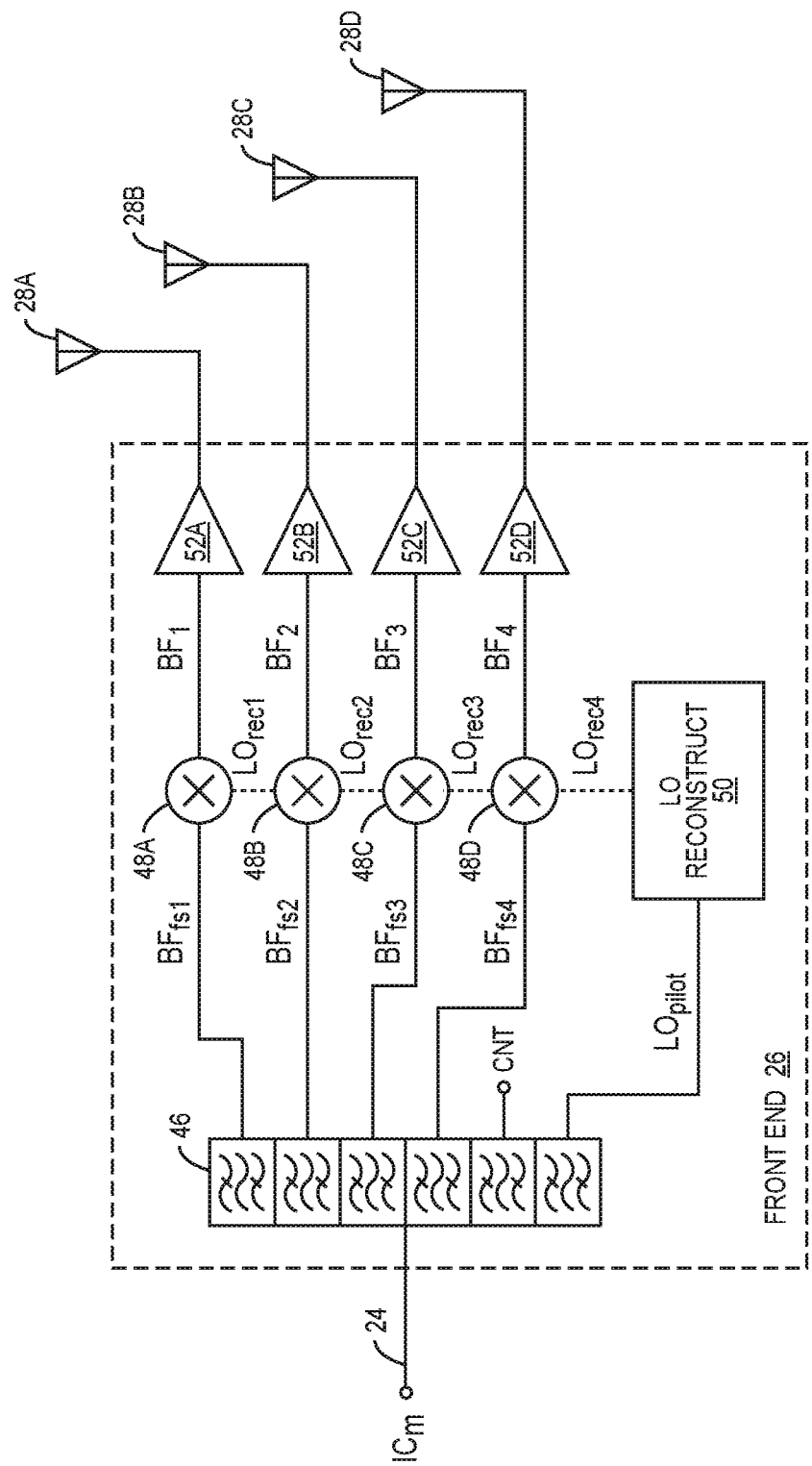
FIG. 6 illustrates front-end circuitry according to one embodiment of the present disclosure.

FIG. 6 shows details of the front-end circuitry 26 according to one embodiment of the present disclosure. The front-end circuitry 26 includes front-end demultiplexer circuitry 46, a number of mixers 48, local oscillator reconstruct circuitry 50, and a number of power amplifiers 52. The front-end demultiplexer circuitry 46 is coupled between the interconnect signal path 24, the mixers 48, and the local oscillator reconstruct circuitry 50. Each one of the mixers 48 is coupled between the front-end demultiplexer circuitry 46 and a different one of the power amplifiers 52. The local oscillator reconstruct circuitry 50 is coupled between the front-end demultiplexer circuitry 46 and the mixers 48. Each one of the power amplifiers 52 is coupled to one of the antennas 28.

In operation, the multiplexed interconnect signal $IC_m$ is received from the transceiver circuitry 22 via the interconnect signal path 24 at the front-end demultiplexer circuitry 46. The front-end demultiplexer circuitry 46 demultiplexes the multiplexed interconnect signal $IC_m$ to isolate the first frequency-shifted RF beamforming signal $BF_{fs1}$, the second frequency-shifted RF beamformed signal $BF_{fs2}$, the third frequency-shifted RF beamforming signal $BF_{fs3}$, the fourth frequency-shifted RF beamforming signal $BF_{fs4}$, the one or more control signals CNT, and the local oscillator pilot signal $LO_{pilot}$. The local oscillator reconstruct circuitry 50 may use the local oscillator pilot signal $LO_{pilot}$ to generate a number of reconstruct local oscillator signals $LO_{rec}$, which are used to shift a frequency of each one of the frequency-shifted RF beamforming signals $BF_{fs}$ back to their original frequency as discussed below. As discussed below, the local oscillator reconstruct circuitry 50 may generate the reconstruct local oscillator signals $LO_{rec}$ without using a synthesizer, such that the front-end circuitry 26 does not require a synthesizer. This saves both power and space in the front-end circuitry 26.

The mixers 48 mix the frequency-shifted RF beamforming signals $BF_{fs}$ with the reconstruct local oscillator signals $LO_{rec}$ to provide RF beamforming signals BF. Specifically, a first mixer 48A mixes the first frequency-shifted RF beamforming signal $BF_{fs1}$ with a first reconstruct local oscillator signal $LO_{rec1}$ to provide a first RF beamforming signal $BF_1$, a second mixer 48B mixes the second frequency-shifted RF beamforming signal $BF_{fs2}$ with a second reconstruct local oscillator signal $LO_{rec2}$ to provide a second RF beamforming signal $BF_2$, a third mixer 48C mixes the third frequency-shifted RF beamforming signal $BF_{fs3}$ with a third reconstruct local oscillator signal $LO_{rec3}$ to provide a third RF beamforming signal $BF_3$, and a fourth mixer 48D mixes the fourth frequency-shifted RF beamforming signal $BF_{fs4}$ with a fourth reconstruct local oscillator signal $LO_{rec4}$ to provide a fourth RF beamforming signal $BF_4$. As discussed above, while the frequency-shifted RF beamforming $BF_{fs}$ signals are shifted in frequency with respect to one another such that they each have a unique frequency, the RF beamforming signals BF all share the same frequency. In the front-end circuitry 26 shown in FIG. 6, the RF beamforming signal restoration circuitry 32 includes the front end demultiplexer circuitry 46, the local oscillator reconstruct circuitry 50, and the mixers 48.

The power amplifiers 52 amplify the RF beamforming signals BF for transmission from the antennas 28. Specifically, a first power amplifier 52A amplifies the first RF beamforming signal $BF_1$ for transmission from the first antenna 28A, a second power amplifier 52B amplifies the second RF beamforming signal $BF_2$ for transmission from the second antenna 28B, a third power amplifier 52C amplifies the third RF beamforming signal $BF_3$ for transmission from the third antenna 28C, and a fourth power amplifier 52D amplifies the fourth RF beamforming signal $BF_4$ for transmission from a fourth antenna 28D.

Figure 7:
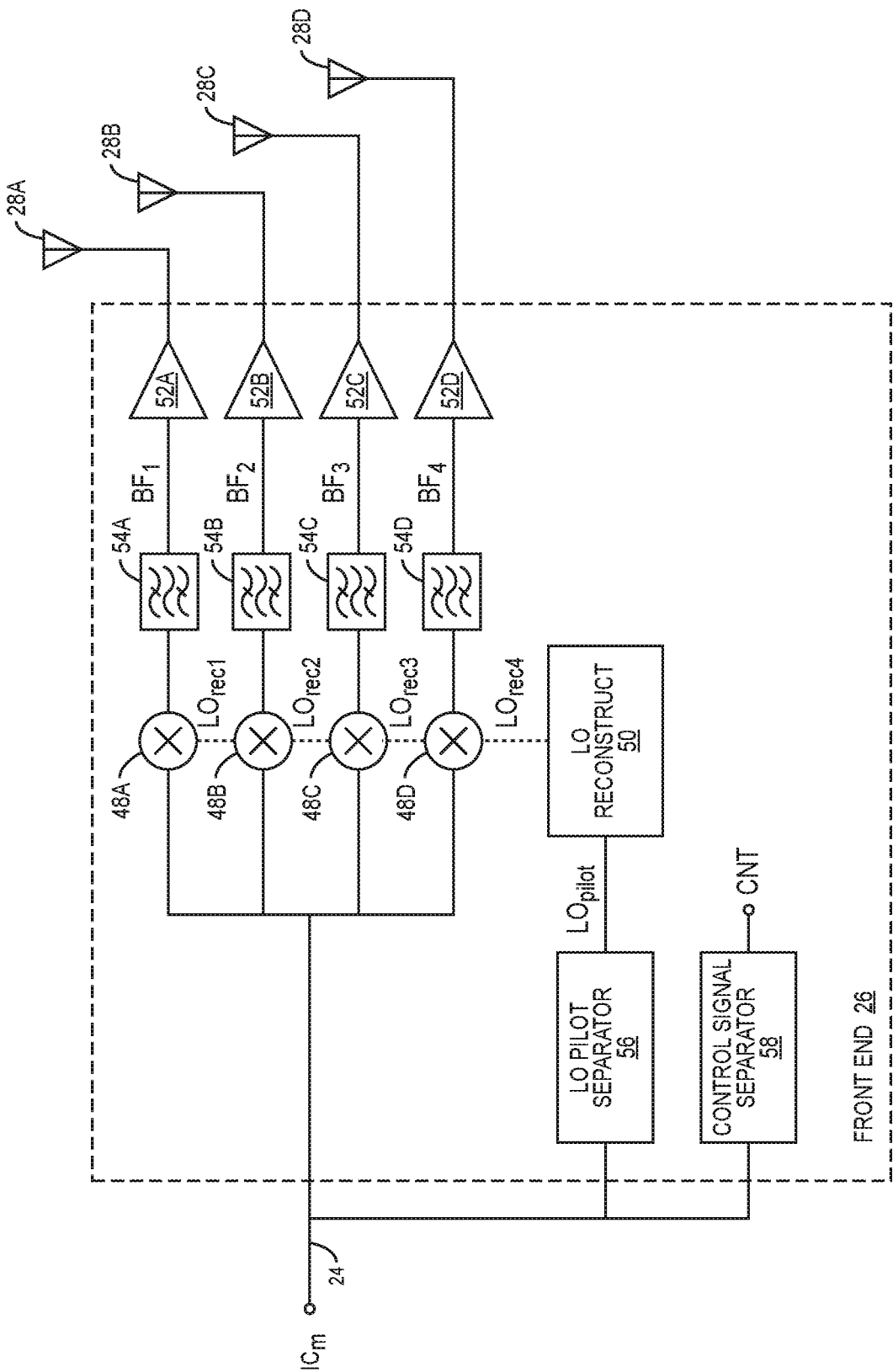
FIG. 7 illustrates front-end circuitry according to one embodiment of the present disclosure.

FIG. 7 shows the front-end circuitry 26 according to an additional embodiment of the present disclosure. The front-end circuitry 26 shown in FIG. 7 is substantially similar to that shown in FIG. 6, except that the front-end demultiplexer circuitry 48 is distributed across multiple components including a number of RF beamforming signal bandpass filters 54, local oscillator pilot separator circuitry 56, and control signal separator circuitry 58. That is, rather than a single demultiplexer, individual filters are used to isolate the signals in the front-end circuitry 26. The front-end circuitry 26 functions in a similar manner to that discussed above, except that filtering for the RF beamforming signals is done after mixing by the mixers 48 rather than before, and is done for each signal path. In the front-end circuitry 26 shown in FIG. 7, the RF beamforming signal restoration circuitry 32 includes the local oscillator pilot separator circuitry 56, the local oscillator reconstruct circuitry 50, the mixers 48, and the RF beamforming signal bandpass filters 54.

As discussed above, in some embodiments the transceiver circuitry 22 may provide multiple local oscillator pilot signals $LO_{pilot}$ in the multiplexed interconnect signal $IC_m$. Each one of these local oscillator pilot signals $LO_{pilot}$ may be used by the local oscillator pilot reconstruct circuitry 50 to generate a different reconstruct local oscillator signal $LO_{rec}$. In such embodiments, the front-end multiplexer circuitry 48 or the local oscillator pilot signal separator circuitry 56 is responsible for separating each one of the local oscillator pilot signals $LO_{pilot}$ from one another. However, since the local oscillator pilot signals $LO_{pilot}$ may be close to one another in frequency, it may be difficult to separate the individual local oscillator pilot signals $LO_{pilot}$ and thus it may be preferable to use the local oscillator reconstruct circuitry 50 to generate multiple reconstruct local oscillator signals $LO_{rec}$ from a single local oscillator pilot signal $LO_{pilot}$.

While the foregoing examples are discussed primarily with respect to four RF beamforming signals BF, those skilled in the art will readily understand that the principles discussed herein can be adapted to RF transmitters providing any number of RF beamforming signals BF provided from any number of antennas.

Figure 8:
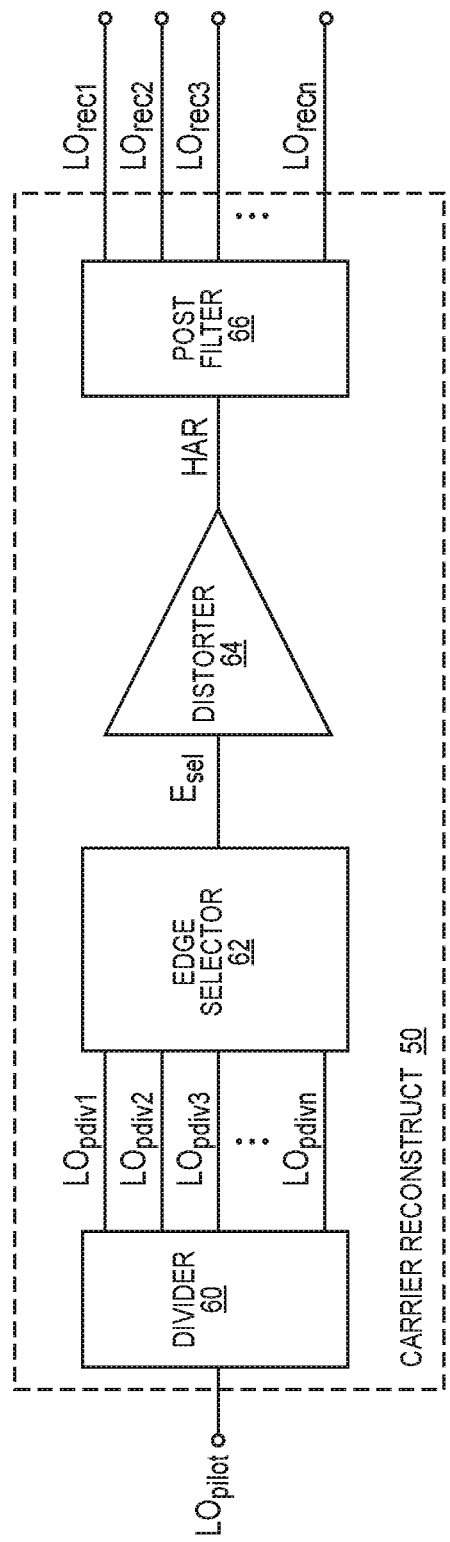
FIG. 8 illustrates local oscillator restoration circuitry according to one embodiment of the present disclosure.

FIG. 8 shows details of the local oscillator reconstruct circuitry 50 according to one embodiment of the present disclosure. The local oscillator reconstruct circuitry 50 includes divider circuitry 60, edge selector circuitry 62, distorter circuitry 64, and post filter circuitry 66. The divider circuitry 60 is coupled to the edge selector circuitry 62, which is in turn coupled to the distorter circuitry 64. The distorter circuitry 64 is coupled to the post filter circuitry 66. In operation, the divider circuitry 60 receives the local oscillator pilot signal $LO_{pilot}$ and divides the local oscillator pilot signal $LO_{pilot}$ to provide a number of divided local oscillator pilot signals $LO_{pdiv1-pdivn}$. In some embodiments, the divider circuitry 60 may be a Johnson counter, and thus each of the divided local oscillator pilot signals $LO_{pdiv1-pdivn}$ may be slightly shifted in phase with respect to one another. The edge selector circuitry 62 selects one or more edges of the divided local oscillator pilot signals $LO_{pdiv1-pdivn}$ to produce a desired signal, which is provided as an edge selected signal $E_{sel}$ to the distorter circuitry 64. The distorter circuitry 64 may be harmonic distorter circuitry that provides one or more harmonics or sub-harmonics of the edge selected signal $E_{sel}$ as a harmonic signal HAR to the post filter circuitry 66. The post filter circuitry 66 may provide the reconstruct local oscillator signals $LO_{rec}$ from the harmonic signal HAR. Notably, there is no synthesizer necessary to produce the reconstruct local oscillator signals $LO_{rec}$ from the local oscillator pilot signal $LO_{pilot}$. As discussed above, this may save power and space in the front-end circuitry 26.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) transmitter comprising:
   transceiver circuitry configured to:
     generate a plurality of frequency-shifted RF beamforming signals such that each one of the frequency-shifted RF beamforming signals has a different frequency;
     generate a local oscillator pilot signal; and
     multiplex the local oscillator pilot signal with the plurality of frequency-shifted RF beamforming signals to provide a multiplexed interconnect signal that includes the plurality of frequency-shifted RF beamforming signals and the local oscillator pilot signal; and
   front-end circuitry coupled to the transceiver circuitry via an interconnect signal path and configured to:
     receive the multiplexed interconnect signal from the transceiver circuitry via the interconnect signal path;
     demultiplex the multiplexed interconnect signal to isolate each of the plurality of frequency-shifted RF beamforming signals and the local oscillator pilot signal;
     use the local oscillator pilot signal to shift a frequency of each one of the plurality of frequency-shifted RF beamforming signals to provide a plurality of RF beamforming signals such that each one of the plurality of RF beamforming signals has a same frequency; and
     transmit each of the plurality of RF beamforming signals from a different antenna.

2. The RF transmitter of claim 1 wherein generating the plurality of frequency-shifted RF beamforming signals comprises:
   generating one or more local oscillator signals;
   generating a plurality of baseband RF beamforming signals; and
   mixing the plurality of baseband RF beamforming signals with the one or more local oscillator signals to provide the plurality of frequency-shifted RF beamforming signals.

3. The RF transmitter of claim 2 wherein shifting the frequency of each one of the plurality of frequency shifted RF beamforming signals comprises:
   generating one or more reconstruct local oscillator signals from the local oscillator pilot signal; and
   mixing the plurality of frequency-shifted RF beamforming signals with the one or more reconstruct local oscillator signals to generate the plurality of RF beamforming signals.

4. The RF transmitter of claim 2 wherein the one or more local oscillator signals are generated from the local oscillator pilot signal.

5. The RF transmitter of claim 3 wherein the front-end circuitry is configured to generate the one or more reconstruct local oscillator signals from the local oscillator pilot signal without using a synthesizer.

6. The RF transmitter of claim 1 wherein shifting the frequency of each one of the plurality of frequency shifted RF beamforming signals comprises:
   generating one or more reconstruct local oscillator signals from the local oscillator pilot signal; and
   mixing the plurality of frequency-shifted RF beamforming signals with the one or more reconstruct local oscillator signals to generate the plurality of RF beamforming signals.

7. The RF transmitter of claim 6 wherein the front-end circuitry is configured to generate the one or more reconstruct local oscillator signals from the local oscillator pilot signal without using a synthesizer.

8. The RF transmitter of claim 6 wherein:
   the front-end circuitry is further configured to:
     mix the plurality of frequency-shifted RF beamforming signals with the one or more reconstruct local oscillator signals to generate the plurality of RF beamforming signals.

9. The RF transmitter of claim 8 wherein the front-end circuitry is configured to generate the one or more reconstruct local oscillator signals from the local oscillator pilot signal without using a synthesizer.

10. Radio frequency (RF) transceiver circuitry comprising:
    frequency-shifted radio frequency (RF) beamforming signal generator circuitry configured to:
      generate a plurality of frequency-shifted RF beamforming signals such that each one of the plurality of frequency-shifted RF beamforming signals has a different frequency;
      generate a local oscillator pilot signal; and multiplex the local oscillator pilot signal with the plurality of frequency-shifted RF beamforming signals to provide a multiplexed interconnect signal that includes the plurality of frequency-shifted RF beamforming signals and the local oscillator pilot signal to front-end circuitry via an interconnect signal path.

11. The RF transceiver circuitry of claim 10 wherein generating the plurality of frequency-shifted RF beamforming signals comprises:
generating one or more local oscillator signals;
generating a plurality of baseband RF beamforming signals; and
mixing the plurality of baseband RF beamforming signals with the one or more local oscillator signals to provide the plurality of frequency-shifted RF beamforming signals.

12. The RF transceiver circuitry of claim 11 wherein the frequency-shifted RF beamforming signal generator circuitry comprises:
digital baseband circuitry configured to generate a plurality of digital baseband RF beamforming signals;
digital to analog converter circuitry configured to convert the plurality of digital baseband RF beamforming signals into the baseband RF beamforming signals;
local oscillator circuitry configured to generate the one or more local oscillator signals; and
mixing circuitry configured to mix the plurality of baseband RF beamforming signals with the one or more local oscillator signals.

13. The RF transceiver circuitry of claim 12 wherein the local oscillator circuitry is configured to generate the one or more local oscillator signals from the local oscillator pilot signal.

14. The RF transceiver circuitry of claim 10 wherein the frequency-shifted RF beamforming signal generator circuitry is digital circuitry.

15. Radio frequency (RF) front-end circuitry comprising:
RF beamforming signal restoration circuitry configured to:
demultiplex a multiplexed interconnect signal from an interconnect signal path to isolate each of a plurality of frequency-shifted RF beamforming signals and a local oscillator pilot signal, wherein each one of the plurality of frequency-shifted RF beamforming signals has a different frequency; and
shift a frequency of each one of the plurality of frequency-shifted RF beamforming signals using the local oscillator pilot signal to provide a plurality of RF beamforming signals such that each one of the plurality of RF beamforming signals has a same frequency; and
transmitter circuitry configured to transmit each of the plurality of RF beamforming signals from a different antenna.

16. The RF front-end circuitry of claim 15 wherein shifting the frequency of each one of the plurality of frequency-shifted RF beamforming signals comprises:
generating one or more reconstruct local oscillator signals from the local oscillator pilot signal; and
mixing the plurality of frequency-shifted RF beamforming signals with the one or more reconstruct local oscillator signals to generate the plurality of RF beamforming signals.

17. The RF front-end circuitry of claim 16 wherein the RF beamforming signal restoration circuitry further comprises:
local oscillator reconstruct circuitry configured to generate the one or more reconstruct local oscillator signals; and
mixer circuitry configured to mix the plurality of frequency-shifted RF beamforming signals with the one or more reconstruct local oscillator signals to generate the plurality of RF beamforming signals.

18. The RF front-end circuitry of claim 17 wherein
the local oscillator reconstruct circuitry is configured to generate the one or more reconstruct local oscillator signals using the local oscillator pilot signal.

19. The RF front-end circuitry of claim 18 wherein the local oscillator reconstruct circuitry is configured to generate the one or more reconstruct local oscillator signals without using a synthesizer.

20. The RF front-end circuitry of claim 17 wherein the local oscillator reconstruct circuitry does not include a synthesizer.

* * * * *